United States Patent [19]

Ihara et al.

[11] Patent Number: 5,378,541
[45] Date of Patent: Jan. 3, 1995

[54] SILICON THIN FILM MEMBER

[75] Inventors: Hisanori Ihara; Hidetoshi Nozaki, both of Yokohama, Japan

[73] Assignee: Kabushiki Kaisha Toshiba, Kawasaki, Japan

[21] Appl. No.: 899,916

[22] Filed: Jun. 17, 1992

[30] Foreign Application Priority Data

Jun. 20, 1991 [JP] Japan .................. 3-148852
Nov. 29, 1991 [JP] Japan .................. 3-317084

[51] Int. Cl.$^6$ ............................................. B32B 17/06
[52] U.S. Cl. .................................... 428/428; 428/336; 428/446; 428/448; 428/450; 428/688; 428/698; 428/699; 428/704
[58] Field of Search ............... 428/446, 448, 450, 688, 428/428, 699, 336, 698, 704

[56] References Cited

U.S. PATENT DOCUMENTS

| | | | |
|---|---|---|---|
| 4,237,150 | 12/1980 | Wiesmann | 428/446 |
| 4,237,151 | 12/1980 | Strongin | 428/446 |
| 4,587,171 | 5/1986 | Hamano | 428/457 |
| 4,749,588 | 6/1988 | Fukuda | 427/74 |

OTHER PUBLICATIONS

Madan, Arun and Shaw, Melvin P., "The Physics and Applications of Amorphous Semiconductors", Academic Press, Inc., San Diego, Calif., (1988), pp. 134–141.

Joannopoulos, J. D. and Lucovsky, "The Physics of Hydrogenated Amorphous Silicon I, Structure, Preparation, and Devices", Springer–Verlag, New York, (1984), pp.200–201.

Pankove, Jacques I., "Semiconductors and Seminetals", Academic Press, Inc., New York, (1984), pp. 1 & 9.

Carlson, D. E. and Magee, C. W., "A SIMS Analysis of Deuterium Diffusion in Hydrogenated Amorphous Silicon", RCA Laboratories, Princeton, N.J. (Apr. 18, 1989), pp. 81–83.

Westerberg, L., Svensson L. E., Karlsson, E., "Stable Absolute Calibration Standards for Hydrogen Profile Analysis Using Nuclear Resonance Techniques", Nuclear Physics and Nuclear Solid State Physics Divisions, Department of Physics, University of Uppsala, Uppsala, Sweden, (1985), pp. 49–54.

Carlson, D. E., Mageen, C. W., and Triano, A. R., "The Effect of Hydrogen Content on the Photovoltaic Properties of Amorphous Silicon", Journal of Electrochem Society, Apr. (1979), pp. 688–691.

*Primary Examiner*—Ellis P. Robinson
*Assistant Examiner*—Timothy M. Speer
*Attorney, Agent, or Firm*—Oblon, Spivak, McClelland, Maier & Neustadt

[57] ABSTRACT

A silicon thin film member according to the present invention comprises a supporting substrate and an a-Si thin film formed by plasma CVD and including hydrogen. The a-Si thin film has a distribution of hydrogen density in which a hydrogen content of the a-Si thin film has a maximum value of $1 \times 10^{22}$ atoms/cm$^3$ or more in a position 20 nm or less away from an interface between the a-Si thin film and the supporting substrate, and the maximum value of the hydrogen content is larger than a hydrogen content of the supporting substrate on the interface. The hydrogen content of the a-Si thin film decreases from the position toward the interface and decreases from the position in a direction from the supporting substrate to the a-Si thin film.

12 Claims, 6 Drawing Sheets

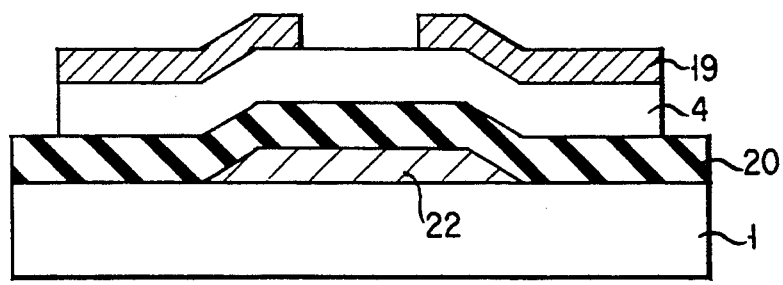
FIG. 6
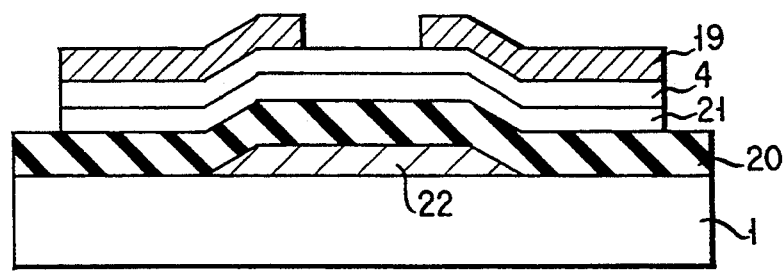
FIG. 7
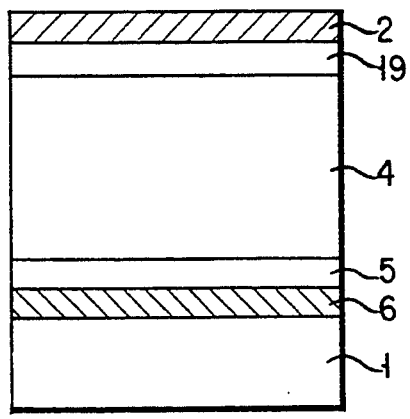 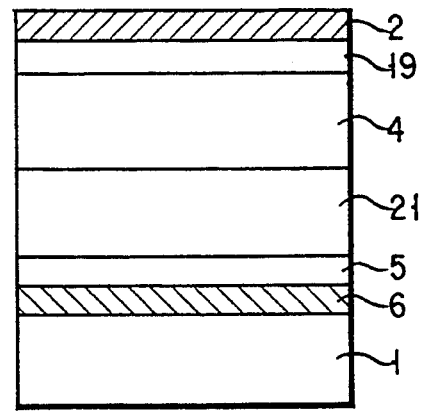
FIG. 8  FIG. 9

SILICON THIN FILM MEMBER

BACKGROUND OF THE INVENTION

1. Field of the Invention

The present invention relates to a silicon thin film member formed by CVD (chemical vapor deposition).

2. Description of the Related Art

A great interest has recently been taken in an amorphous silicon (a-Si) thin film used as material for elements such as thin film transistors. The a-Si thin film is generally formed on a semiconductor substrate including silicon and the like by means of plasma CVD. The substrate is then damaged by charged particles generated when plasma is produced, and a number of defects may occur in an interface between the substrate and a-Si thin film.

A method of forming an a-Si thin film without changing the initial discharge power density which is set lower than 32 mW/cm$^2$, is proposed (Preprint of 1991 Spring Applied Physics Meeting, 28P-P-S8, p.753 and 28P-S-4, p.752). However, according to "Extended Abstract of the 22nd (1990 International) Conference on Solid State Device and Materials, 1990, pp 681–684" which shows a method of evaluating an interface in the a-Si thin film proposed by the inventors, it has turned out that a number of defects occur in the interface even when the a-Si thin film is formed by the plasma CVD. These defects adversely affect the characteristics of a device using the a-Si thin film. In particular, the defects may be fatal to a device whose characteristics greatly depend upon the defects, such as a thin film transistor in which an interface between the substrate and a-Si thin film serves as an active layer.

SUMMARY OF THE INVENTION

It is an object of the present invention to provide a silicon thin film member of a CVD film formed of silicon whose defect density is low.

According to one aspect of the present invention, there is provided a silicon thin film member comprising a substrate including hydrogen, and a CVD film supported on the supporting substrate and including silicon as a main ingredient and hydrogen, wherein the CVD film has a distribution of hydrogen density in which a hydrogen content of the CVD film has a maximum value in a position 20 nm or less away from an interface between the CVD film and the supporting substrate, and the maximum value is larger than a hydrogen content of the supporting substrate, the hydrogen content decreasing from the position toward the interface and decreasing from the position in a direction from the supporting substrate to the CVD film.

According to another aspect of the present invention, there is provided a silicon thin film member comprising a substrate including hydrogen, and a CVD film supported on the supporting substrate and including silicon as a main ingredient and hydrogen, wherein the CVD film has a distribution of hydrogen density in which a hydrogen content of the CVD film has a maximum value of $1 \times 10^{22}$ atoms/cm$^3$ or more in a position 20 nm or less away from an interface between the CVD film and the supporting substrate, and the maximum value of the hydrogen content is larger than a hydrogen content of the supporting substrate on the interface, the hydrogen content decreasing from the position toward the interface and decreasing from the position in a direction from the supporting substrate to the CVD film.

According to still another aspect of the present invention, there is provided a silicon thin film member comprising a substrate of a silicon nitride film including hydrogen, and a CVD film supported on the supporting substrate and including silicon as a main ingredient and hydrogen, wherein the CVD film has a distribution of hydrogen density in which a hydrogen content of the CVD film has a maximum value of $1 \times 10^{22}$ atoms/cm$^3$ or more in a position 20 nm or less away from an interface between the CVD film and the supporting substrate, and the maximum value of the hydrogen content is larger than a hydrogen content of the supporting substrate on the interface, the hydrogen content decreasing from the position toward the interface and decreasing from the position in a direction from the supporting substrate to the CVD film.

It is desirable that the CVD film includes silicon as a main ingredient, such as amorphous silicon, polysilicon, silicon carbide silicon nitride, and silicon germanium. The CVD film of the amorphous silicon has crystal grain diameter less than 3 nm, and the CVD film of the polysilicon has a crystal grain diameter of 3 nm or more.

The inventors of the present invention have found that the distribution of the hydrogen content of the silicon film formed on the supporting substrate has a mountain-like peak in the vicinity of the interface between the supporting substrate and the silicon film and, when the hydrogen content at the peak is larger than the hydrogen content of the supporting substrate, the defect density is considerably lowered on the interface. The use of a silicon film member having the above distribution of the hydrogen content enables a semiconductor device free from variation in element characteristics and decrease in element reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a cross-sectional view of an a-Si thin film transistor according to another embodiment of the present invention;

FIG. 7 is a cross-sectional view of an a-Si thin film transistor according to still another embodiment of the present invention;

FIG. 8 is a cross-sectional view of an a-Si solar cell according to still another embodiment of the present invention;

FIG. 9 is a cross-sectional view of an a-Si solar cell according to yet another embodiment of the present invention;

DETAILED DESCRIPTION OF THE PREFERRED EMBODIMENTS

Embodiments of the present invention will now be described, with reference to the accompanying drawings.

FIGS. 1A to 1E are cross-sectional views showing the steps of manufacturing an a-Si diode according to an embodiment of the present invention.

Figure 1A:
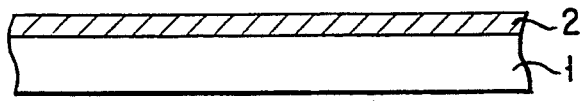
FIGS. 1A to 1E are cross-sectional views showing the steps of manufacturing an a-Si diode according to an embodiment of the present invention.
Figure 2:
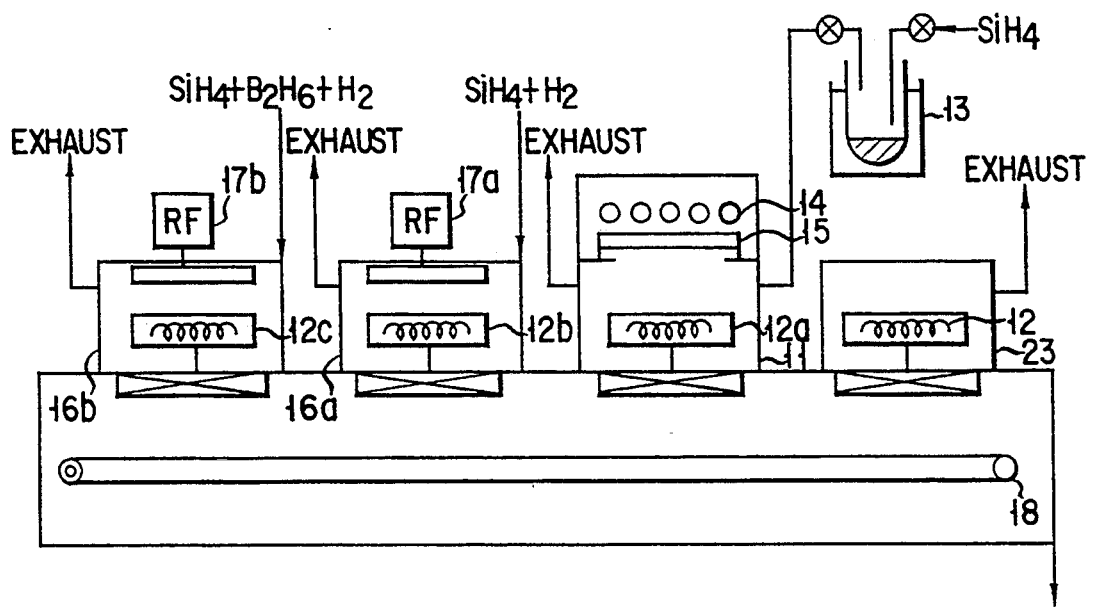
FIG. 2 is a schematic view of a CVD device according to the embodiment of the present invention.

As shown in FIG. 1A, a Ti electrode 2 is formed on a substrate 1 including glass or the like by vacuum deposition. The substrate 1 is inserted in a preparation chamber 23 of a CVD equipment shown in FIG. 2, and heated up to 200° C. by a heater 12. The substrate 1 is then inserted in a photo CVD chamber 11 using a conveyer belt 18.

After the substrate 1 is heated again up to 200° C. by a heater 12a, $SiH_4$ gas containing mercury vapor and having a flow rate of 7.6 SCCM is introduced into the photo CVD chamber 11 through a mercury reservoir 13, and the gas pressure in the photo CVD chamber 11 is set to 0.2 Torr.

Figure 1B:
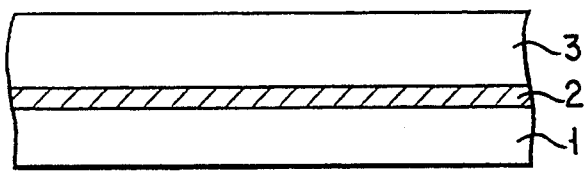

When the gas pressure is 0.2 Torr and the temperature of the substrate 1 is sufficiently stabilized at 200° C., a low-pressure mercury lamp 14 is turned on to irradiate the photo CVD chamber 11 with a light beam having a wavelength of 185 nm and a light beam having a wavelength of 254 nm through a quartz window 15. The $SiH_4$ gas is thus decomposed by the mercury sensitized reaction between beams and a mercury. Using mercury sensitized photo CVD, a supporting substrate 3 of an a-Si film containing hydrogen and having a thickness of 1 $\mu$m is formed on the Ti electrode 2, as shown in FIG. 1B.

The substrate 1 is inserted in a first plasma CVD chamber 16a in a vacuum state using a conveyer belt 18, and then heated up to 200° C. by the heater 12b. A mixed gas of $SiH_4$ and $H_2$ gases each having a flow rate of 75 SCCM is introduced into the first plasma CVD chamber 16a.

Figure 1C:
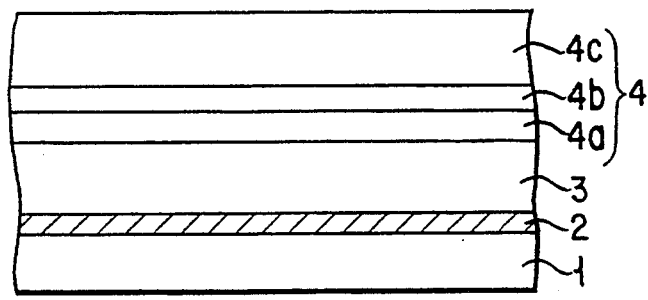

When the temperature of the substrate 1 is 200° C. and the gas pressure in the plasma CVD chamber 16 is sufficiently stabilized at 0.4 Torr, a high frequency of 13.56 MHz is generated by a high-frequency generating source 17a, and the mixed gas of the $SiH_4$ and $H_2$ gases is decomposed by the high frequency, with the result that an a-Si thin film 4 containing hydrogen (hereinafter referred to as a-Si:H thin film) having a laminated structure, which includes a first a-Si thin film 4a having a thickness of 15 nm, a second a-Si:H thin film 4b having a thickness of 5 nm, and a third a-Si:H thin film 4c having a thickness of 1 $\mu$m, is formed on the supporting substrate 3, as shown in FIG. 1C. The conditions for forming these a-Si:H thin films 4a, 4b and 4c differ from one another only in discharge power density.

The density of discharge power applied for 10 seconds from the beginning of discharge, is set to 150 mW/cm² as a predetermined value to form the first a-Si:H thin film 4a. The second a-Si:H thin film 4b is then formed while the discharge power density is decreasing at a rate of 10 mW/cm² per second. When the discharge power density reaches 20 mW/cm² after a lapse of 23 seconds from the beginning of discharge, the discharge power density is fixed for two hours, thereby forming the third a-Si:H thin film 4c.

The first a-Si:H film 4a can be formed by resetting the discharge power density to not less than 150 mW/cm². The discharge power density can fall within a range between 60 and 400 mW/cm², though 150 mW/cm² is selected as a predetermined value. A mixed gas of $SiH_4$ and $SiH_2$ gases can be decomposed with great efficiency if the discharge power density falls within the above range. Therefore, the first a-Si thin film 4a having a high hydrogen density can be formed. Though the discharge power density reaches 20 mW/cm² after a lapse of 23 seconds from the beginning of discharge, it can fall within a range between 5 and 50 mW/cm², because an a-Si:H thin film having a small amount of combination of Si and $H_2$ can be formed within this range, as Si—H bonds form more easily where there are defects in the silicon lattice structure, as is conventionally known by those skilled in the art.

The substrate 1 is moved by the conveyer belt 18 and inserted in a second plasma CVD chamber 16b in a vacuum state, and then heated up to 200° C. by a heater 12c. A mixed gas of $SiH_4$, $H_2$ and $B_2H_6$ gases is introduced into the plasma CVD chamber 16b.

Figure 1D:
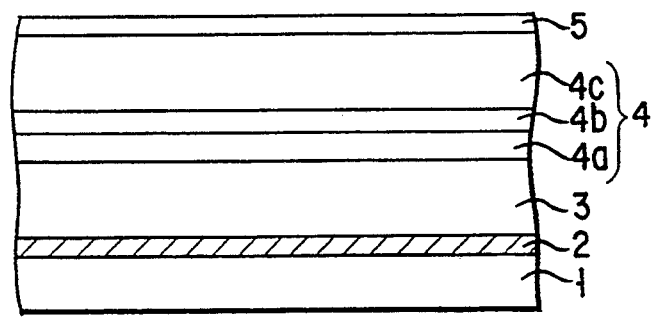
Figure 1E:
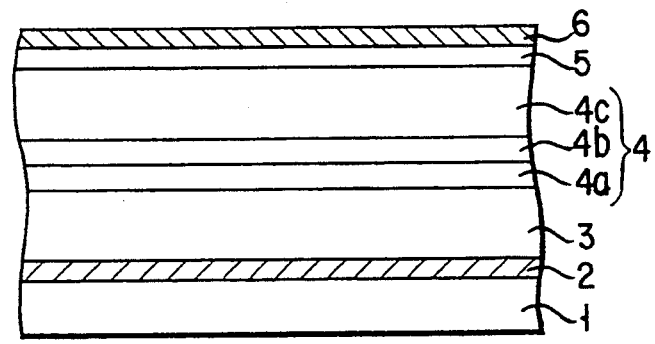

A high frequency of 13.56 MHz is generated by a high-frequency generating source 17b, and the mixed gas of the $SiH_4$, $H_2$ and $B_2H_6$ gases is decomposed by the high frequency, with the result that an a-Si:H thin film 5 doped with boron is formed on the third a-Si:H film 4c, as shown in FIG. 1D.

Finally, the substrate 1 is inserted in a sputtering equipment, and a transparent electrode 6 including ITO (indium tin oxide) and having a thickness of 35nm is formed on the a-Si:H thin film 5, thereby completing an a-Si diode.

The density of defects in an interface between the supporting substrate (photo CVD a-Si:H thin film) 3 and the first a-Si:H thin film (plasma CVD a-Si:H thin film) 4a of the a-Si diode so obtained, has been examined using a quasi-static C-V method.

Figure 3:
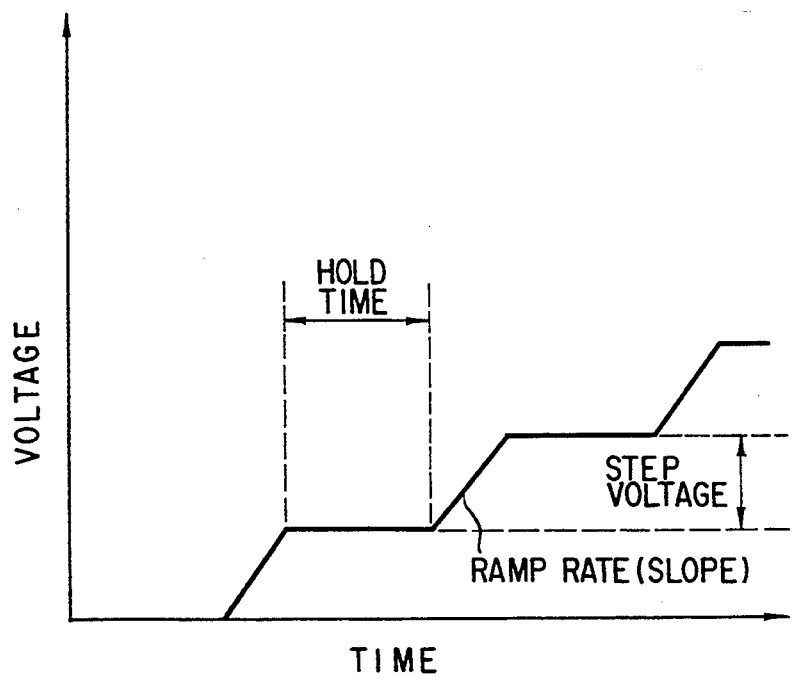
FIG. 3 is a graph showing the waveform of applied voltage detected by a quasi-static C-V (capacitance-voltage) method.

The conditions of examination of the density are that a measurement temperature is a room temperature (23° C.) and, an applied voltage has a waveform as shown in FIG. 3 (start voltage is 0.0 V, stop voltage is −3.0 V, step voltage is 50 mV, ramp rate is 5 mV/sec, and hold time 30 sec). The defect density in a conventional case has been examined on the same conditions to compare it with that in the present invention. In the conventional case, the defect density in an interface between an a-

Si:H thin film formed by the mercury sensitized photo CVD having a constant discharge power of 32 mW/cm² and an a-Si:H thin film formed on the former a-Si:H film by the plasma CVD having a constant discharge power of 20 mW/cm², has been examined.

Figure 4:
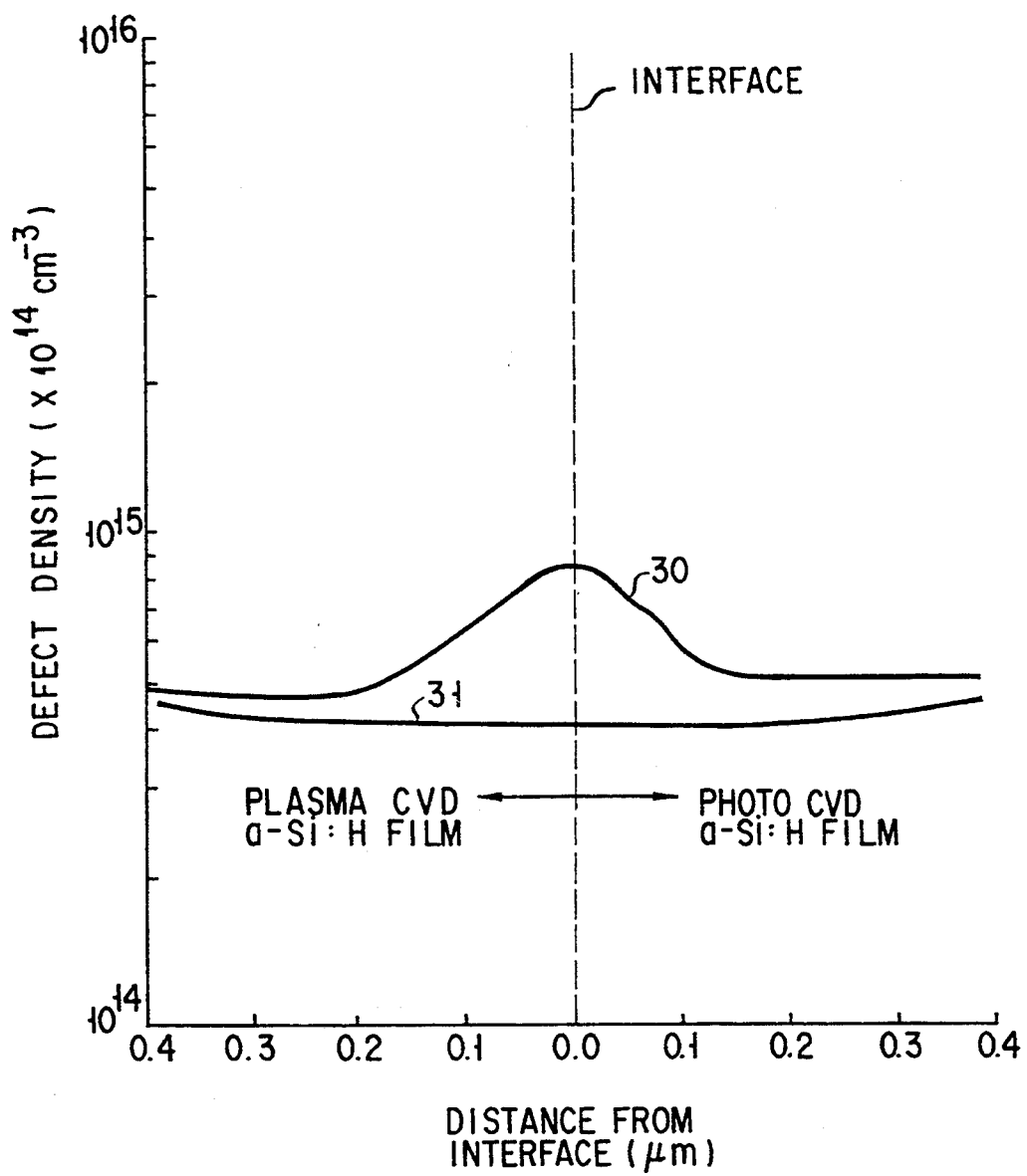
FIG. 4 is a graph showing the relationship between the distance from an interface and the defect density.

FIG. 4 is a graph showing results of the above examination and a relationship between a distance from the interface and the defect density. In FIG. 4, a curved line 30 indicates the result in the conventional case, and a curved line 31 indicates the result in the present invention. It is understood from FIG. 4 that, in the conventional case, the defect density becomes the highest on the interface and, in the present invention, the defect density is virtually constant and considerably small, irrespective of the distance from the interface.

Further, the inventors have examined the hydrogen content of the interface between the supporting substrate 3 (photo CVD a-Si:H thin film) and the first a-Si:H thin film 4a (plasma CVD a-Si:H thin film) using secondary-ion mass spectrometry (SIMS) and also examined it in the conventional case to compare them with each other.

Figure 5:
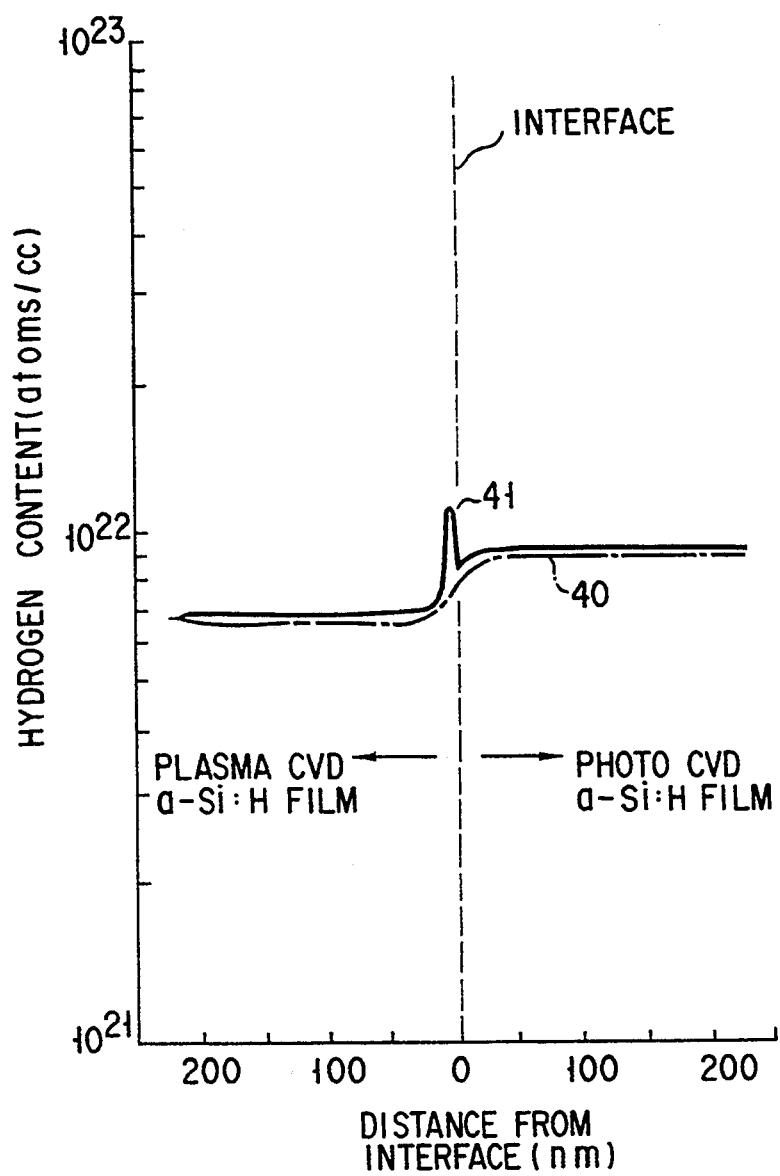
FIG. 5 is a graph showing the relationship between the distance away from the interface and the hydrogen content.

FIG. 5 is a graph showing results of the above examination and a relationship between a distance away from the interface and the hydrogen content. In FIG. 5, a curved line 40 indicates the result in the conventional case, and a curved line 41 indicates the result in the present invention. It is understood from FIG. 5 that the hydrogen content is uniformly increased from the plasma CVD a-Si:H thin film to the photo CVD a-Si:H thin film in the a-Si diode obtained by the conventional case, but, in the a-Si diode of the present invention, the hydrogen content is suddenly increased within 20 nm of the interface (excluding the interface) between the plasma CVD thin a-Si:H film and the photo CVD a-Si thin film to the plasma CVD a-Si:H thin film side and, its peak exceeds $1 \times 10^{22}$ atoms/cc and is greater than the hydrogen content of the photo CVD a-Si:H thin film in the interface.

As a result, the following are understood. The first a-Si:H thin film 4a has a distribution chart of hydrogen which is shaped like a high mountain and in which the hydrogen content is maximized in the vicinity of the interface. The maximum hydrogen content of the first a-Si:H thin film 4a is obtained and is 1.4 or more times as much as that of the third a-Si:H thin film 4c in a region 50 nm or less away from the interface. Furthermore, it is desirable that the hydrogen contents of the second and third a-Si:H thin films 4b and 4c (in the region 50 nm or less away from the interface) are each set to $1 \times 10^{22}$ atoms/cc or less to reduce the defect density.

As described above, the defect density is low in the interface, though the a-Si:H thin film is formed using the plasma CVD in which the discharge power density is high at the beginning of the formation, and this low defect density is achieved by virtue of a large amount of hydrogen.

According to the above embodiment of the present invention, the first a-Si:H thin film 4a is first formed at high discharge power density, and then the discharge power density is reduced to form the second and third a-Si:H thin films 4b and 4c, thereby forming the a-Si:H thin film 4 having a laminated structure in which the density of defects is low in the interface between the film 4 and the supporting substrate 3. Consequently, an a-Si diode of high-performance and high-reliability can be obtained.

The present invention is not limited to the above embodiment. A high frequency of 13.56 MHz is used in the embodiment, but another high frequency can be used.

In the above embodiment, the discharge power density is decreased at a rate of 10 mW/cm² per second to form the second a-Si:H thin film 4b. However, the discharge power density can be decreased at a higher rate, increased once, or modulated.

Further, even when a digital CVD technique is used in which a predetermined a-Si:H thin film is formed and then another a-Si:H thin film is formed on it after some internal if the discharge power density of 60 to 400 mW/cm² is selected and set so that the a-Si:H thin films each have a thickness of 20 nm or less and contains a large amount of hydrogen, the same advantage can be obtained.

In the above embodiment, the a-Si:H thin film is used as the supporting substrate 3. However, it can be replaced with an amorphous silicon nitride film, an oxide film such as alumina and silicon oxide, a silicon carbide film, etc.

Figure 10:
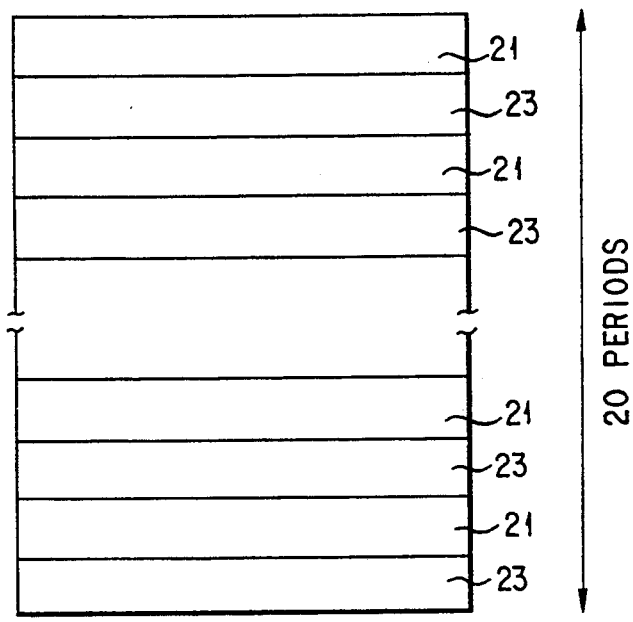
FIG. 10 is a cross-sectional view of an a-Si super lattice device according to yet another embodiment of the present invention.
Figure 11:
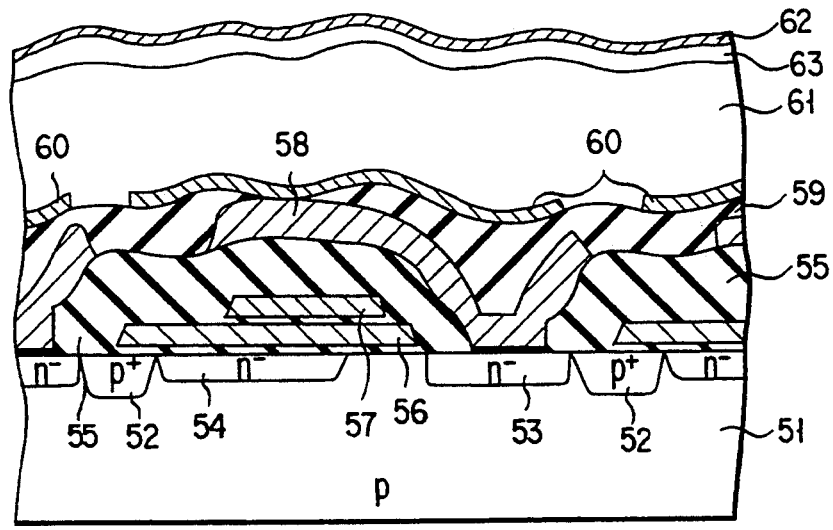
FIG. 11 is a cross-sectional view of a solid-state imaging device according to another embodiment of the present invention.
Figure 12:
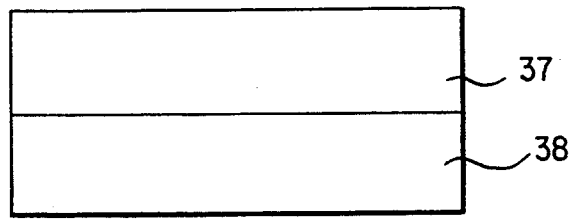
FIG. 12 is a cross-sectional view of a heterojunction according to another embodiment of the present invention.

Though the a-Si diode is described in the above embodiment, the present invention can be applied to another semiconductor element such as an a-Si thin film transistor as shown in FIGS. 6 and 7, an a-Si solar cell as shown in FIGS. 8 and 9, an a-Si super lattice device as shown in FIG. 10, a solid-state imaging device as shown in FIG. 11, and a hetero-bipolar transistor with a hetero junction as shown in FIG. 12.

when the present invention is applied to the a-Si thin film transistor shown in FIG. 6, the defect density in the interface between an insulation film 20 and a-Si:H thin film 4 serving as an active layer can be decreased. When it is applied to the a-Si thin film transistor shown in FIG. 7, that is, when the active layer has a laminated structure of a-Si:H thin films 4 and 21, the defect density in each interface between these films can be decreased, and thus the characteristics and reliability of the transistor can be improved. In FIGS. 6 and 7, reference numeral 19 indicates an a-Si:H thin film doped with phosphorus, and numeral 22 denotes a gate electrode.

When the present invention is applied to the a-Si solar cell shown in FIG. 8, the defect density in the interface between the a-Si:H thin film 5 doped with boron and the a-Si:H thin film 4 serving as an active layer can be decreased. When it is applied to the solar cell shown in FIG. 9, that is, when the active layer has a laminated structure of a-Si:H films 4 and 21, the defect density in each interface between these films can be decreased, and thus the characteristics and reliability of the solar cell can be improved. Though the a-Si:H film 5 doped with boron is used in the solar cells shown in FIGS. 8 and 9, it can be replaced with an a-Si$_{1-x}$C$_x$:H thin film (amorphous silicon carbide thin film) and, in this case, the same effect can be obtained.

When the present invention is applied to the a-Si super lattice device shown in FIG. 10, the defect density in the interface between the a-Si:H thin film 33 (whose thickness is 5 nm) and a-Si$_{1-x}$N$_x$:H thin film (amorphous silicon nitride film) 35 (whose thickness is 5 nm) can be decreased, and thus the characteristics and reliability of the super lattice device can be improved.

The super lattice device shown in FIG. 10 is constituted of 20 periods, that is, 20 pairs of the a-Si:H thin film 33 and a-Si$_{1-x}$N$_x$:H thin film 35. However, the present invention can be applied to a super lattice device constituted of 21 or more periods, or 19 or less periods.

When the present invention is applied to the solid-state imaging device shown in FIG. 11, the defect density in the interface between an a-Si:H thin film 61 and an a-Si$_{1-x}$C$_x$:H thin film 63 doped with boron can be decreased, and thus the characteristics and reliability of the solid-state imaging device can be improved.

The solid-state imaging device has a two-layered structure of an a-Si photoelectric conversion film and a CCD scanner. In FIG. 11, reference numeral 51 indicates a p-type semiconductor substrate, 53 an storage diode, 54 a vertical CCD, 56 and 57 a transfer gate electrode, 55 and 59 an insulation film, 58 an extracted electrode, and 60 a pixel electrode, all of which constitute a CCD imaging device substrate. The a-Si:H thin film 61 serves as a photoconductive film and the a-Si$_{1-x}$C$_x$:H thin film doped with boron 63 serves as an electronic blocking layer, and they constitute a photoconversion film. A transparent electrode 62 is formed on the photoelectric conversion film. Reference numeral 52 represents a p$^+$-type element separation region.

When the present invention is applied to the hetero bipolar transistor used hetero junction shown in FIG. 12, the defect density in the interface between a silicon substrate 38 and an a-Si$_{1-x}$Ge$_x$:H thin film 37 can be decreased. For this reason, the characteristics and reliability of the hetero bipolar transistor can be improved.

In the above embodiment, the a-Si thin film is used mainly as a silicon film. However, even if it is replaced with another silicon film such as a polysilicon film, silicon carbide film, silicon nitride, and a silicon germanium film, the same advantage can be obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

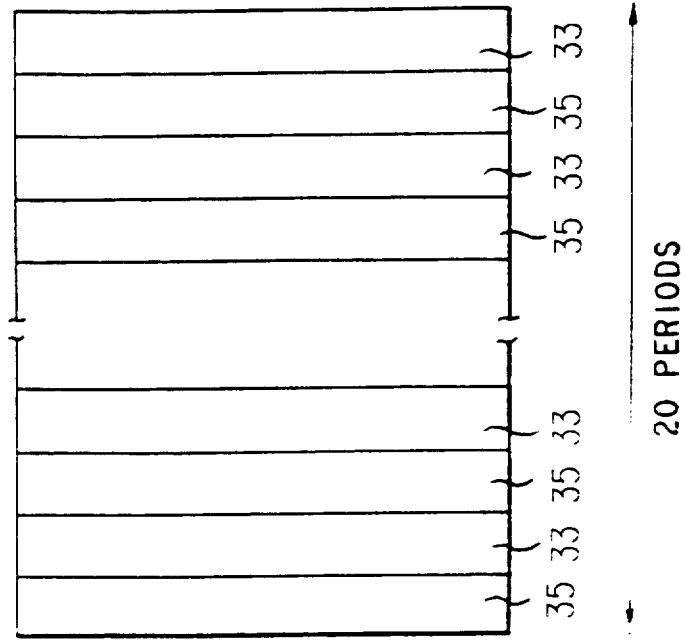

What is claimed is:

1. A silicon thin film member comprising
   a supporting substrate containing hydrogen, and a CVD film containing silicon and hydrogen supported on said supporting substrate
   wherein said CVD film has a distribution of hydrogen density in which the hydrogen content of said CVD film has a maximum value in a position 20 nm or less away from the interface between said CVD film and said supporting substrate and the maximum value is larger than the hydrogen content of said supporting substrate,
   and where said maximum value of said hydrogen content in said CVD film is at least $1\times10^{22}$ atoms/cm$^3$.

2. A silicon thin film member according to claim 1, wherein the maximum value of the hydrogen content of said CVD film in a region 20 nm or less away from the interface is 1.4 or more times than the maximum value of the hydrogen content of said CVD film in a region more than 20 nm and not more than 50 nm away from the interface.

3. A silicon thin film member according to claim 2, wherein said hydrogen content in said region more than 20 nm and not more than 50 nm away from the interface is $1\times10^{22}$ atoms/cm$^3$ or less.

4. A silicon thin film member according to claim 1, wherein said CVD film is formed of one selected from the group consisting of amorphous silicon, polysilicon, silicon carbide, silicon nitride, silicon oxide and silicon germanium.

5. A silicon thin film member according to claim 1, wherein said supporting substrate is formed of one selected from the group consisting of amorphous silicon, silicon oxide, silicon carbide, and silicon nitride.

6. A silicon thin film member comprising
   a supporting substrate of a silicon nitride film containing hydrogen, and a CVD film containing silicon and hydrogen supported on said supporting substrate
   wherein said CVD film has a distribution of hydrogen density in which the hydrogen content of said CVD film has a maximum value in a position 20 nm or less away from the interface between said CVD film and said supporting substrate and the maximum value is larger than the hydrogen content of said supporting substrate,
   and where said maximum value of said hydrogen content in said CVD film is at least $1\times10^{22}$ atoms/cm$^3$.

7. A silicon thin film member according to claim 6, wherein the maximum value of the hydrogen content of said CVD film in a region 20 nm or less away from the interface is 1.4 or more times than the maximum value of the hydrogen content of said CVD film in a region more than 20 nm and not more than 50 nm away from the interface.

8. A silicon thin film member according to claim 7, wherein said CVD film is formed of one selected from the group consisting of amorphous silicon, polysilicon, silicon carbide, and silicon germanium.

9. A silicon thin film member comprising a supporting substrate containing hydrogen, and a CVD film containing silicon and hydrogen supported on said supporting substrate,
   wherein said CVD film has a distribution of hydrogen density in which the hydrogen content of said CVD film has a maximum value of $1\times10^{22}$ atoms/cm$^3$ or more in a position of 20 nm or less away from the interface between said CVD film and said supporting substrate, and the maximum value is larger than the hydrogen content of said supporting substrate on the interface, said hydrogen content of said CVD film decreasing from said position toward the interface and decreasing from said position toward a direction opposite to said interface.

10. A silicon thin film member according to claim 9, wherein the maximum value of the hydrogen content of said CVD film in a region 20 nm or less away from the interface is 1.4 or more times than the maximum value of the hydrogen content of said CVD film in a region more than 20 nm and not more than 50 nm away from the interface.

11. A silicon thin film member according to claim 10, wherein said CVD film is formed of one selected from the group consisting of amorphous silicon, polysilicon, silicon carbide, silicon nitride, silicon oxide and silicon germanium.

12. A silicon thin film member according to claim 9, wherein said supporting substrate is formed of one selected from the group consisting of amorphous silicon, silicon oxide, silicon carbide, and silicon nitride.

* * * * *

UNITED STATES PATENT AND TRADEMARK OFFICE
CERTIFICATE OF CORRECTION

PATENT NO.　：　5,378,541　　　　　　　　　　Page 1 of 2
DATED　　　　：　Jan. 3, 1995
INVENTOR(S)：　Hisanori Ihara et al It is certified that error appears in the above-indentified patent and that said Letters Patent is hereby corrected as shown below:

The drawing sheet, consisting of Fig. 10, should be deleted to be replaced with the drawing sheet, as shown on the attached page.

Signed and Sealed this

Thirtieth Day of January, 1996

Attest:

BRUCE LEHMAN

Attesting Officer

Commissioner of Patents and Trademarks